US012780651B2

(12) United States Patent
Yamaguchi et al.

(10) Patent No.: US 12,780,651 B2
(45) Date of Patent: Nov. 3, 2026

(54) METHOD FOR MANUFACTURING CURVED SURFACE SUPPORT STRUCTURE, AND HEMISPHERICAL RESONATOR GYROSCOPE

(71) Applicant: TOKYO KEIKI INC., Tokyo (JP)

(72) Inventors: Takayoshi Yamaguchi, Tokyo (JP); Kazuaki Tani, Tokyo (JP)

(73) Assignee: Tokyo Keiki Inc., Tokyo (JP)

( * ) Notice: Subject to any disclaimer, the term of this patent is extended or adjusted under 35 U.S.C. 154(b) by 407 days.

(21) Appl. No.: 18/287,204

(22) PCT Filed: Mar. 25, 2022

(86) PCT No.: PCT/JP2022/014314
§ 371 (c)(1),
(2) Date: Oct. 17, 2023

(87) PCT Pub. No.: WO2022/224704
PCT Pub. Date: Oct. 27, 2022

(65) Prior Publication Data

US 2024/0199414 A1 Jun. 20, 2024

(30) Foreign Application Priority Data

Apr. 23, 2021 (JP) ................................. 2021-073086

(51) Int. Cl.
*B81C 1/00* (2006.01)
*G01C 19/5691* (2012.01)
*G01C 19/5783* (2012.01)

(52) U.S. Cl.
CPC ...... *B81C 1/00166* (2013.01); *B81C 1/00134* (2013.01); *B81C 1/00158* (2013.01);
(Continued)

(58) Field of Classification Search
CPC .. B81B 1/00134–0019; B81B 1/00269; B81B 1/00357; B81B 2201/0242;
(Continued)

(56) References Cited

U.S. PATENT DOCUMENTS 6,474,161 B1 11/2002 Jeanroy et al.
7,839,059 B2 11/2010 Choi et al.
(Continued)

FOREIGN PATENT DOCUMENTS

| | | | | |
|---|---|---|---|---|
| CN | 110749315 | A | 2/2020 | |
| JP | 2016148659 | A | 8/2016 | |
| WO | WO-2025205825 | A1 * | 10/2025 | ............... B81C 1/00 |

OTHER PUBLICATIONS

M. H. Asadian, D. Wang and A. M. Shkel, "Fused Quartz Dual-Shell Resonator Gyroscope," in Journal of Microelectromechanical Systems, vol. 31, No. 4, pp. 533-545, Aug. 2022, doi: 10.1109/JMEMS.2022.3166213. (Year: 2022).*
(Continued)

*Primary Examiner* — Christine S. Kim
*Assistant Examiner* — Tyler J Wiegand
(74) *Attorney, Agent, or Firm* — Cooper Legal Group LLC

(57) ABSTRACT

One embodiment comprises: forming an annular recess on an upper surface of a lower wafer, and a stem having a tip higher than at a radially-outer-surface a generally center of the recess; forming first electrodes arranged on the radially-outer-surface; forming a sacrificial layer; forming second electrodes arranged on a bottom surface of an upper wafer; bonding the upper wafer and the lower wafer with the sacrificial layer in between; separating a radially outer portion, which is located at a radially outer side of the upper wafer relative to the second electrodes; vacuum heating the upper wafer, the lower wafer, and the sacrificial layer under
(Continued)

a condition where a pressure in a cavity defined by the upper wafer, the lower wafer, and the sacrificial layer is different from an ambient pressure; and removing the sacrificial layer after the vacuum heating at the pressure different from the ambient pressure.

15 Claims, 10 Drawing Sheets

(52) U.S. Cl.
CPC ...... *B81C 1/00182* (2013.01); *B81C 1/00269* (2013.01); *B81C 1/00357* (2013.01); *B81B 2201/0242* (2013.01); *G01C 19/5691* (2013.01); *G01C 19/5783* (2013.01)

(58) Field of Classification Search
CPC ........................... B81B 1/00468–00484; B81B 1/00626–00634; G01C 19/5691
See application file for complete search history.

(56) References Cited

U.S. PATENT DOCUMENTS

| | | | | |
|---|---|---|---|---|
| 10,612,925 | B2 | 4/2020 | Najafi et al. | |
| 2017/0016742 | A1* | 1/2017 | Shkel | G01C 25/00 |
| 2017/0233247 | A1* | 8/2017 | Shkel | B81B 7/0074 438/48 |
| 2018/0188030 | A1* | 7/2018 | Shang | G01C 19/5691 |
| 2023/0061042 | A1* | 3/2023 | Goto | B81C 1/00158 |

OTHER PUBLICATIONS

M. H. Asadian, Y. Wang and A. M. Shkel, “Development of 3D Fused Quartz Hemi-Toroidal Shells for High-Q Resonators and Gyroscopes,” in Journal of Microelectromechanical Systems, vol. 28, No. 6, pp. 954-964, Dec. 2019, doi: 10.1109/JMEMS.2019.2945713. (Year: 2019).*

Corresponding International Patent Application No. PCT/JP2022/014314, Written Opinion, date mailed Jun. 21, 2022, 8 pages.

Corresponding International Patent Application No. PCT/JP2022/014314, International Search Report, date mailed Jun. 21, 2022, 5 pages.

D. Senkal, C.R. Raum, A.A. Trusov, A.M. Shkel, “Titania Silicate / Fused Quartz Glassblowing for 3-D Fabrication of Low Internal Loss Wineglass Micro-Structures”, Solid-State, Actuators, and Microsystems Workshop, 2012, DOI: 10.31438/trf.hh2012.72, 4 pages.

P. Pai, F. K. Chowdhury, C. H. Mastrangelo and M. Tabib-Azar, “MEMS-based hemispherical resonator gyroscopes,” SENSORS, 2012 IEEE, Taipei, Taiwan, 2012, pp. 1-4, doi: 10.1109/ICSENS.2012.6411346, 4 pages.

D. Senkal, M. J. Ahamed, M. H. A. Ardakani, S. Askari and A. M. Shkel, “Demonstration of 1 Million Q-Factor on Microglassblown Wineglass Resonators With Out-of-Plane Electrostatic Transduction,” in Journal of Microelectromechanical Systems, vol. 24, No. 1, pp. 29-37, Feb. 2015, doi: 10.1109/JMEMS.2014.2365113, 9 pages.

* cited by examiner

METHOD FOR MANUFACTURING CURVED SURFACE SUPPORT STRUCTURE, AND HEMISPHERICAL RESONATOR GYROSCOPE

TECHNICAL FIELD

The embodiments of the present invention relate to curved surface supported structures that can be used as hemispherical resonator gyroscopes.

BACKGROUND ART

Hemispherical resonator gyroscopes are known which are gyroscopes that detect angular velocity. This type of hemispherical resonator gyroscope 9 has a resonator 91 formed in a generally hemispherical shape, a stem 90 supporting the resonator 91, a plurality of electrodes 92 formed on the outside of the resonator 91 and disposed in an annular pattern, and a plurality of electrodes 93 formed on the inside of the resonator 91 and disposed in an annular pattern, as shown in FIGS. 19 and 20.

In the hemispherical resonator gyroscope 9, a plurality of electrodes 92 or 93 are used alternately in the circumferential direction as either sensing electrodes 92A, 93A or control electrodes 92B, 93B. The resonator 91 resonates by electrostatic attraction when a restraining voltage is applied to the control electrodes 92B, 93B. When angular velocity is input in this state, the resonance pattern of the resonator 91 rotates according to the angular velocity, and the angular velocity can be determined by measuring the capacitance between the resonator 91 and the sensing electrodes 92A, 93A. It may also be possible to use a plurality of electrodes 94 formed beneath the resonator 91 and disposed in an annular pattern (see FIG. 20) as sensing electrodes or actuation electrodes.

The Q-factor of the resonator and the relative positions of the electrodes determine the performance of such hemispherical resonator gyroscopes. In order to increase the Q-factor of the resonator to reduce noise and improve performance, quartz or synthetic glass with a low thermoelastic modulus is used for the resonator. The resonators are made by processing quartz or synthetic glass, both of which are difficult materials to work with and require high precision machining. Therefore, such a resonator manufacturing process requires mechanical polishing and cutting followed by final shape adjustment by laser machining, which makes the manufacturing cost very high.

In order to reduce the manufacturing cost of the resonators, manufacturing methods based on the MEMS (Micro Electro Mechanical Systems) process may be proposed. A known method for this kind of manufacturing is to process a quartz wafer into what is called a wine glass or bird bath shape by heating it to a deformable temperature and then suctioning or pressurizing it.

However, such methods require laser cutting and polishing when the resonator is separated, as well as bonding the resonator with adhesive or other means to a substrate on which electrodes are formed. As a result, the alignment accuracy is often inferior to that of semiconductor machines used in common MEMS processes, and the performance of the hemispherical resonator gyroscopes produced by this method may be deteriorated. Moreover, since this method is not a batch production process, the cost of manufacturing the hemispherical resonator gyroscopes will be high.

CITATION LIST

Patent Document

Patent document 1: JP2016-148659
Patent document 2: U.S. Pat. No. 6,474,161
Patent document 3: U.S. Pat. No. 7,839,059
Patent document 4: U.S. Pat. No. 10,612,925

Non-Patent Document

Non-patent document 1: D. Senkal, C. R. Raum, A. A. Trusov, A. M. Shkel, "TITANIA SILICATE/FUSED QUARTZ GLASSBLOWING FOR 3-D FABRICATION OF LOW INTERNAL LOSS WINEGLASS MICRO-STRUCTURES", Solid-State, Actuators, and Microsystems Workshop, 2012, DOI: 10.31438/trf.hh2012.72

Non-patent document 2: P. Pai, F. K. Chowdhury, C. H. Mastrangelo and M. Tabib-Azar, "MEMS-based hemispherical resonator gyroscopes," SENSORS, 2012 IEEE, Taipei, Taiwan, 2012, pp. 1-4, doi: 10.1109/ICSENS.2012.6411346.

Non-patent document 3: D. Senkal, M. J. Ahamed, M. H. A. Ardakani, S. Askari and A. M. Shkel, "Demonstration of 1 Million Q-Factor on Microglassblown Wineglass Resonators With Out-of-Plane Electrostatic Transduction," in Journal of Microelectromechanical Systems, vol. 24, no. 1, pp. 29-37, February 2015, doi: 10.1109/JMEMS.2014.2365113.

DISCLOSURE OF THE INVENTION

Problems to be Solved by the Invention

The problem that embodiments of the present invention seek to solve is to provide, at a lower cost, a technique that enables the manufacturing of curved surface supported structures that can be used as hemispherical resonator gyroscopes.

Means for Solving the Problems

In order to solve the above-mentioned problem, the method for manufacturing a curved surface supported structure comprising an upper wafer and a lower wafer, the method comprising: forming an annular recess on an upper surface of the lower wafer by etching, and a stem having a tip higher than a radially-outer-surface a generally center of the recess by etching the radially-outer-surface, which is a plane located radially outer side of the recess; forming a plurality of first electrodes arranged on the radially-outer-surface; forming a sacrificial layer, which is an annular deposition pattern on the plurality of first electrodes; forming a plurality of second electrodes, which are arranged on a bottom surface of the upper wafer in correspondence with the plurality of first electrodes; bonding the upper wafer and the lower wafer with the sacrificial layer in between so that the plurality of first electrodes and the plurality of second electrodes are superimposed; separating a radially outer portion, which is located radially outer side of the upper wafer than the second electrodes by etching after the bonding; vacuum heating the upper wafer, the lower wafer, and the sacrificial layer are under a condition where a pressure in a cavity defined by the upper wafer, the lower wafer, and the sacrificial layer is different from an ambient pressure after the separating; and removing the sacrificial layer by etching, after the vacuum heating at the pressure different from the ambient pressure.

Advantageous Effects of the Invention

The embodiments of the present invention enable the manufacturing of curved surface supported structures that can be used as hemispherical resonator gyroscopes at a lower cost.

BEST MODE FOR CARRYING OUT THE INVENTION

In the following, embodiments of the invention are described with reference to the drawings.

Method for Manufacturing a Curved Surface Supported Structure

Figure 1:
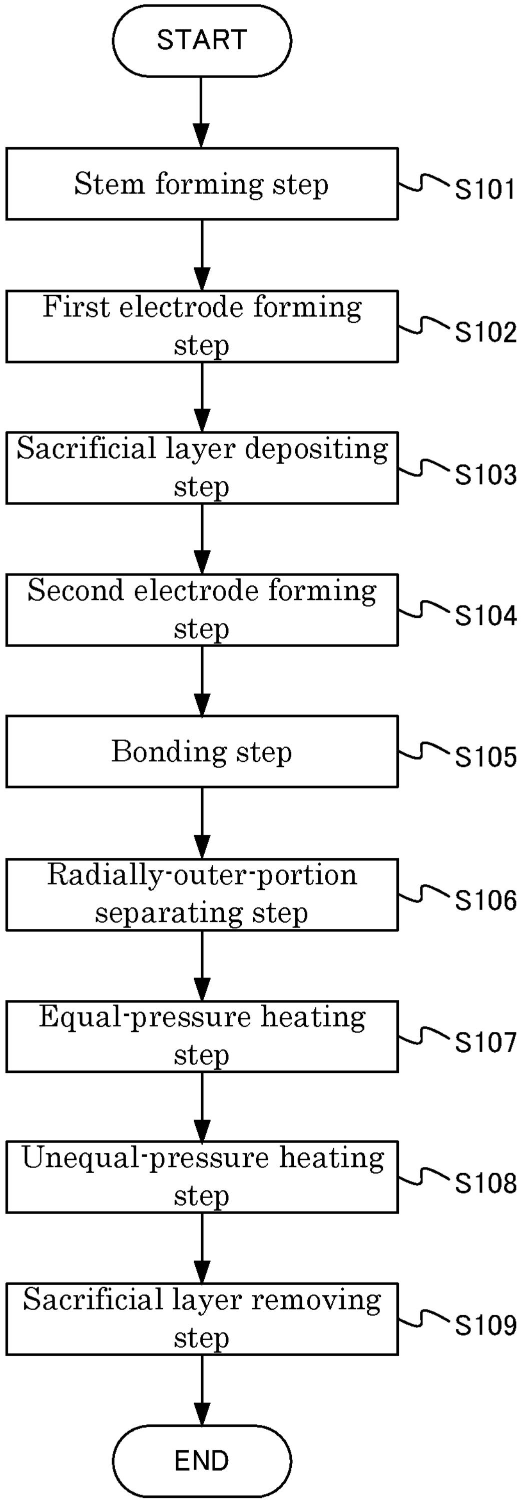
FIG. 1 is a flow chart showing the steps of the manufacturing method for the curved surface supported structure of the embodiment.

An outline of the method for manufacturing a curved surface supported structure of the present embodiment will be described. FIG. 1 is a flow chart showing the steps of the manufacturing method for the curved surface supported structure of the embodiment. The details of each step will be described later.

As shown in FIG. 1, initially for a lower wafer, a stem forming step is performed to form a stem supporting a curved surface by etching (S101), a first electrode forming step is performed to form first electrodes (S102), and a sacrificial layer depositing step is performed to form a deposition pattern of a sacrificial layer (S103). Then, a second electrode forming step is performed to form second electrodes on the upper wafer (S104).

After the sacrificial layer depositing step and the second electrode forming step are performed, a bonding step is performed to bond the upper wafer and the lower wafer together by the sacrificial layer (S105), and a radially-outer-portion separating step is performed to separate the radially outer portion of the upper wafer (S106).

After the radially-outer-portion separating step is performed, an equal-pressure heating step (S107) and an unequal-pressure heating step (S108) are performed, in which a vacuum heating is performed by a vacuum heater equipped with a chamber, and then a sacrificial layer removing step (S109) is performed to remove the sacrificial layer, thereby manufacturing a curved surface supported structure which can be used as a hemispherical resonator gyroscope.

Stem Forming Step

Figure 2:
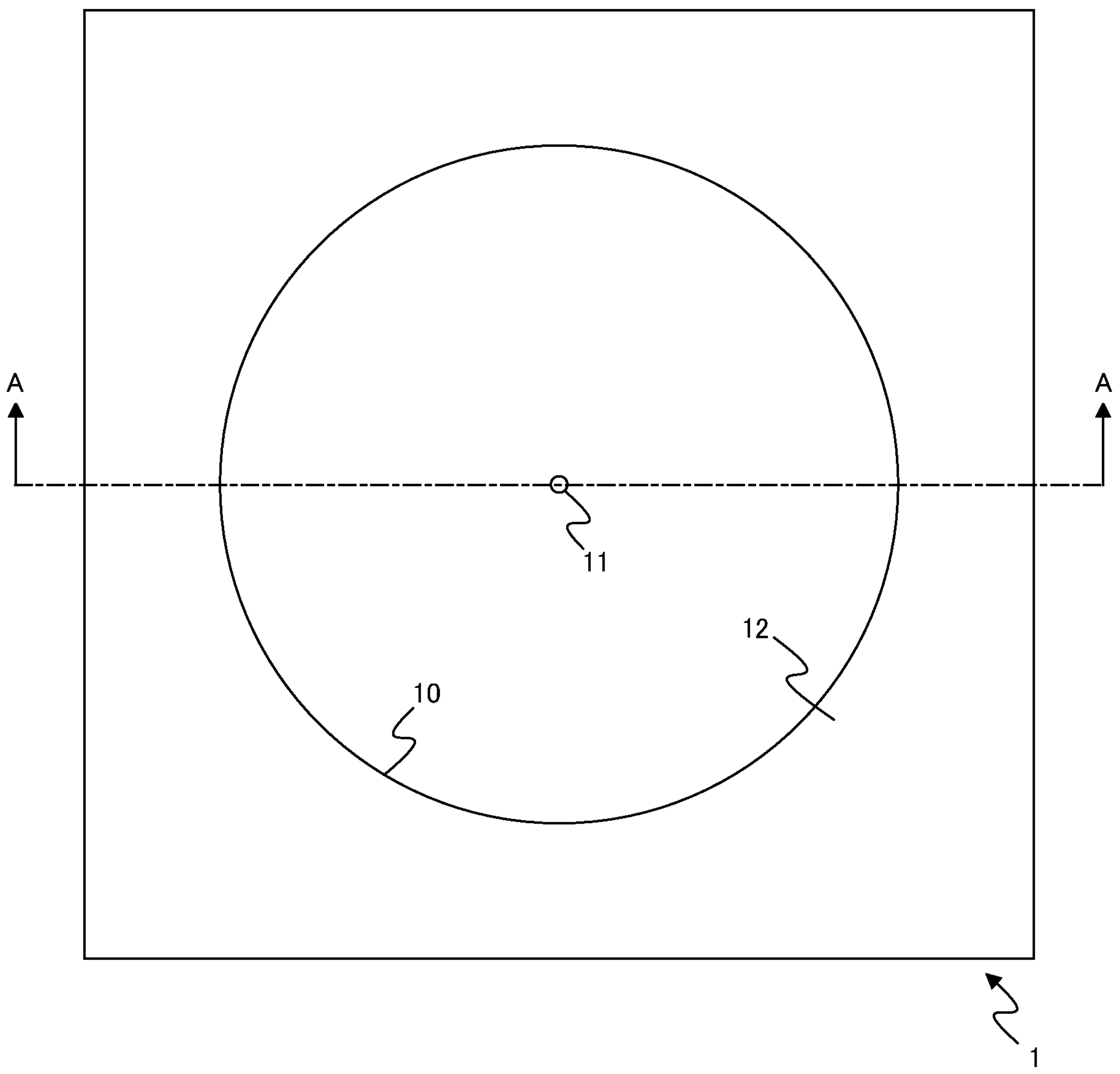
FIG. 2 is a plan view showing the configuration of the lower wafer on which a recess is formed.
Figure 3:
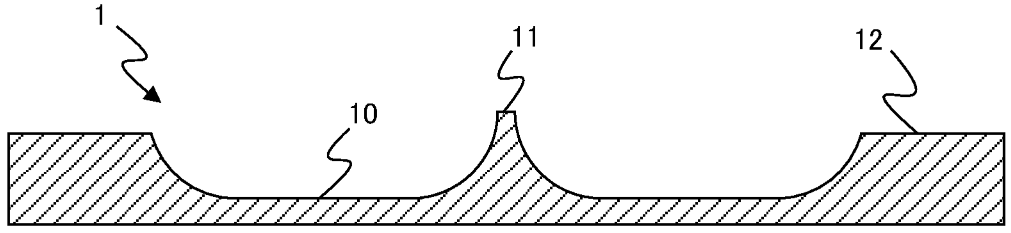
FIG. 3 is a cross section of FIG. 2 cut by the A-A line.

The stem forming step is described below. FIG. 2 is a plan view showing the configuration of the lower wafer on which a recess is formed. FIG. 3 is a cross section of FIG. 2 cut by the A-A line.

The stem forming step is a step to form a stem 11 by forming an annular recess on the lower wafer 1, as shown in FIGS. 2 and 3. The lower wafer 1 is a plate-shaped member made from silicon compounds such as synthetic quartz, silicon, Tempax glass, or low expansion glass. In the stem forming step, a recess 10 is formed on its top surface by isotropic etching, and a radially-outer-surface 12, which is a plane at a height lower than the tip of the stem 11, is formed on the radially outer side of the recess 10 by etching. The distance of height difference between the tip of the stem 11 and the radially-outer-surface 12 will be described in detail later.

First Electrode Forming Step

Figure 4:
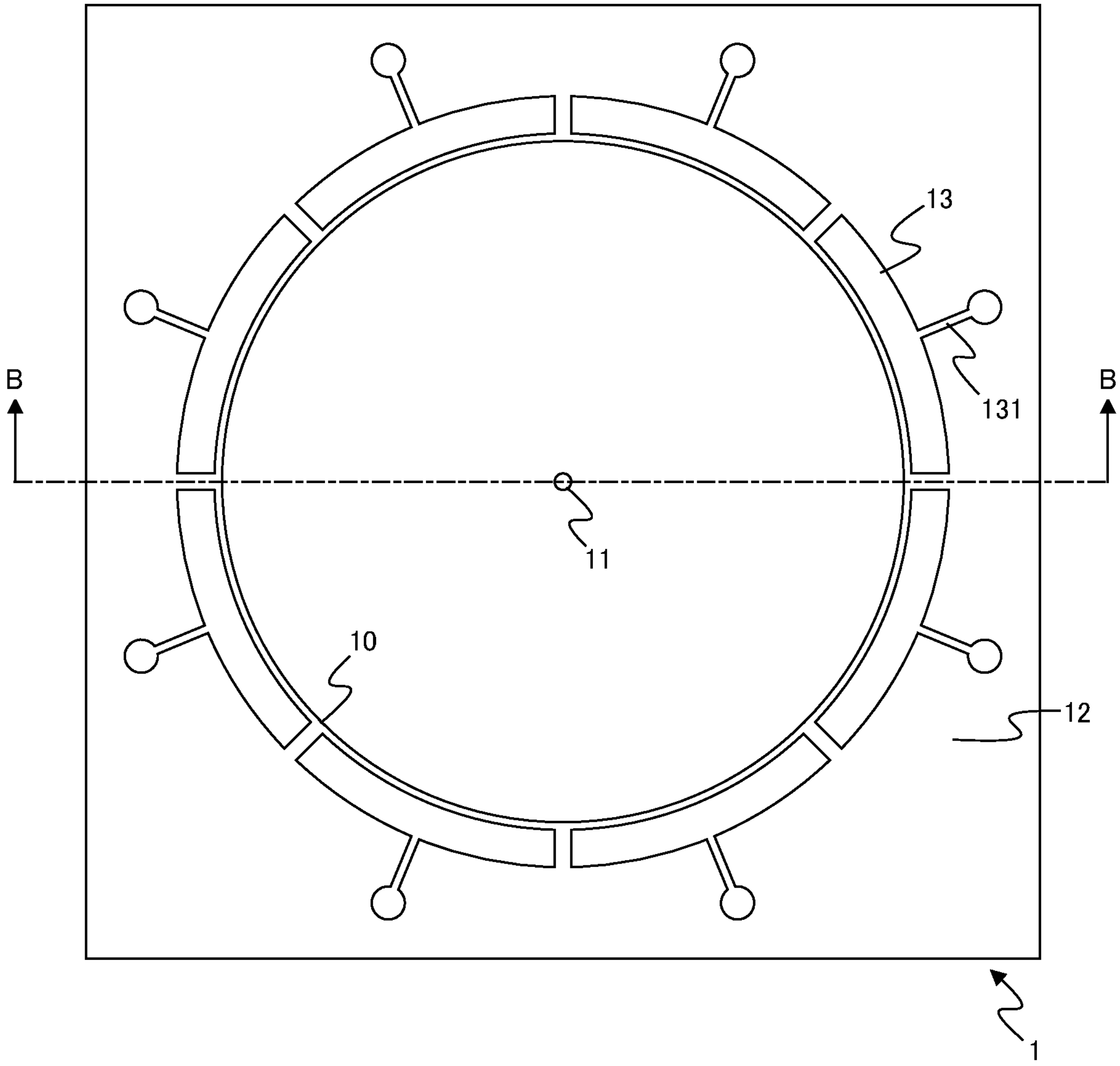
FIG. 4 is a plan view showing the configuration of the lower wafer on which electrodes are formed.
Figure 5:
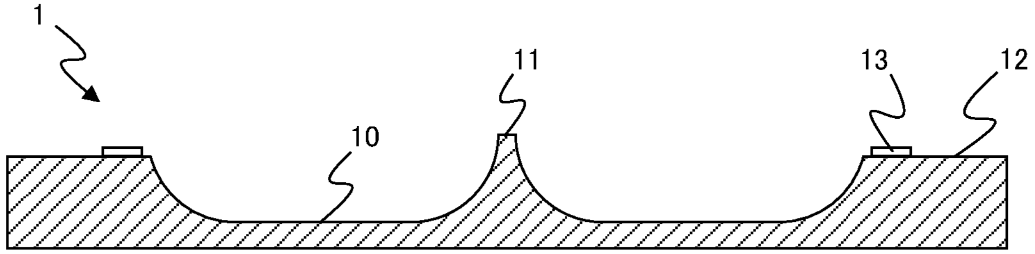
FIG. 5 is a cross section of FIG. 4 cut by the B-B line.

The first electrode forming step is described below. FIG. 4 is a plan view showing the configuration of the lower wafer on which electrodes are formed. FIG. 5 is a cross section of FIG. 4 cut by the B-B line.

The first electrode forming step is a step to form a plurality of first electrodes 13 made of high-melting point metal on the radially-outer-surface 12 of the lower wafer 1, as shown in FIGS. 4 and 5. The plurality of first electrodes 13 are formed to be arranged in an annular pattern on the radially-outer-surface 12 so as to surround the recess 10. Each of the plurality of first electrodes 13 has a connection line 131 extending radially outward.

Sacrificial Layer Depositing Step

Figure 6:
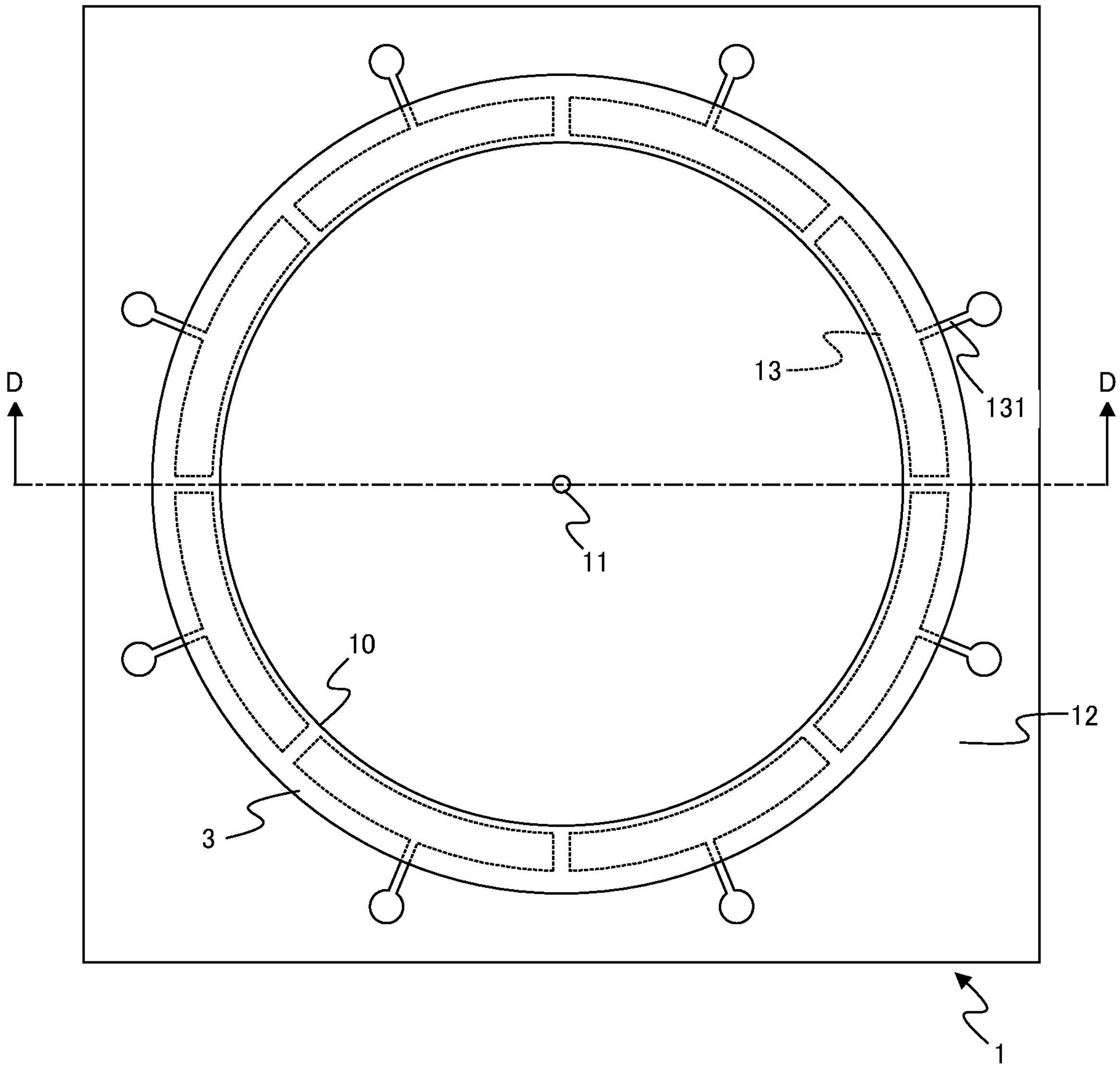
FIG. 6 is a plan view showing the configuration of the lower wafer on which a sacrificial layer is formed.
Figure 7:
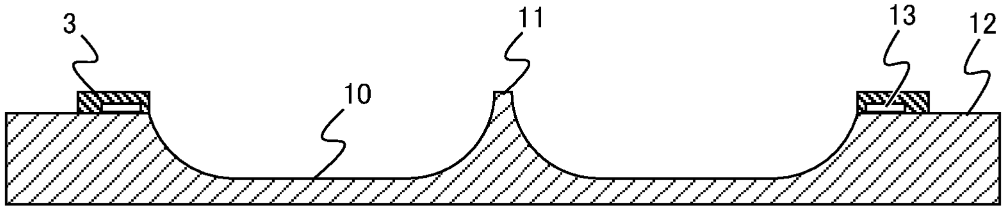
FIG. 7 is a cross section of FIG. 6 cut by the C-C line.

The sacrificial layer depositing step is described below. FIG. 6 is a plan view showing the configuration of the lower wafer on which a sacrificial layer is formed. FIG. 7 is a cross section of FIG. 6 cut by the C-C line.

The sacrificial layer depositing step, as shown in FIGS. 6 and 7, is a step to form a sacrificial layer, which is an annular deposition pattern 3 covering the plurality of electrodes 13, with liquid glass such as TEOS (Tetraethyl Orthosilicate Tetraethoxysilane) or polysilazane. The deposition pattern is kept in a semi-solid state until the bonding step described later.

Second Electrode Forming Step

Figure 8:
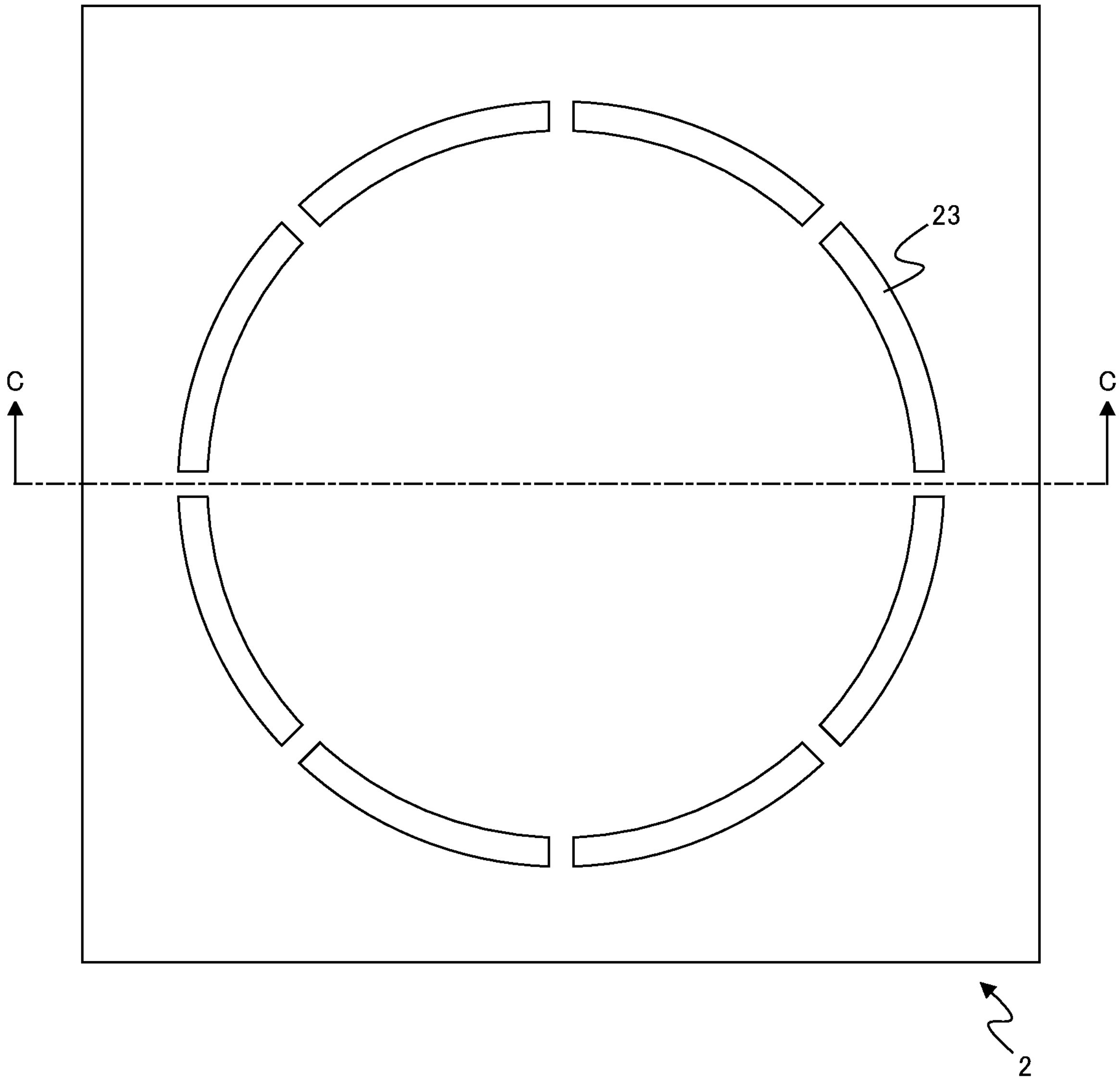
FIG. 8 is a bottom view showing the configuration of the upper wafer on which electrodes are formed.
Figure 9:
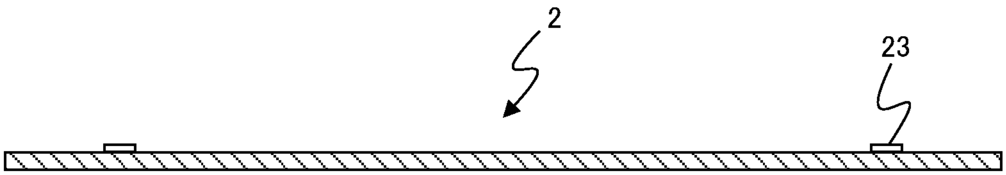
FIG. 9 is a cross section of FIG. 8 cut by the D-D line.

The second electrode forming step is described below. FIG. 8 is a bottom view showing the configuration of the upper wafer on which electrodes are formed. FIG. 9 is a cross section of FIG. 8 cut by the D-D line.

The second electrode forming step is a step to form a plurality of second electrodes 23 on the upper wafer 2, as shown in FIGS. 8 and 9. Like the lower wafer 1, the upper wafer 2 is a plate-shaped member made from silicon compounds such as synthetic quartz, silicon, Tempax glass, or low expansion glass. In the second electrode forming step, a plurality of second electrodes 23 corresponding to each of the plurality of first electrodes 13 are formed on the bottom surface of the upper wafer 2. The plurality of second electrodes 23 are formed so that they are arranged in an annular pattern in the same manner as the plurality of first electrodes 13.

In this embodiment, each of the plurality of second electrodes 23, when superimposed on a corresponding first electrode 13, is assumed to be formed small enough to fit within the area of the first electrode 13, but alternatively the first electrodes 13 may be formed smaller than the second electrodes 23. Forming one of the first electrodes 13 or second electrodes 23 to fit within the area of the other, as described above, can minimize adverse effects caused by possible misalignments in the bonding step.

In the stem forming step, the radially-outer-surface 12 is etched so that the distance between the tip of the stem 11 and the radially-outer-surface 12 is greater than the distance of the combined thicknesses of the first electrode 13 and the second electrode 23. This creates a gap between the first electrodes 13 and the second electrodes 23 when they are superimposed in the bonding step, which will be described in detail later.

Bonding Step

Figure 10:
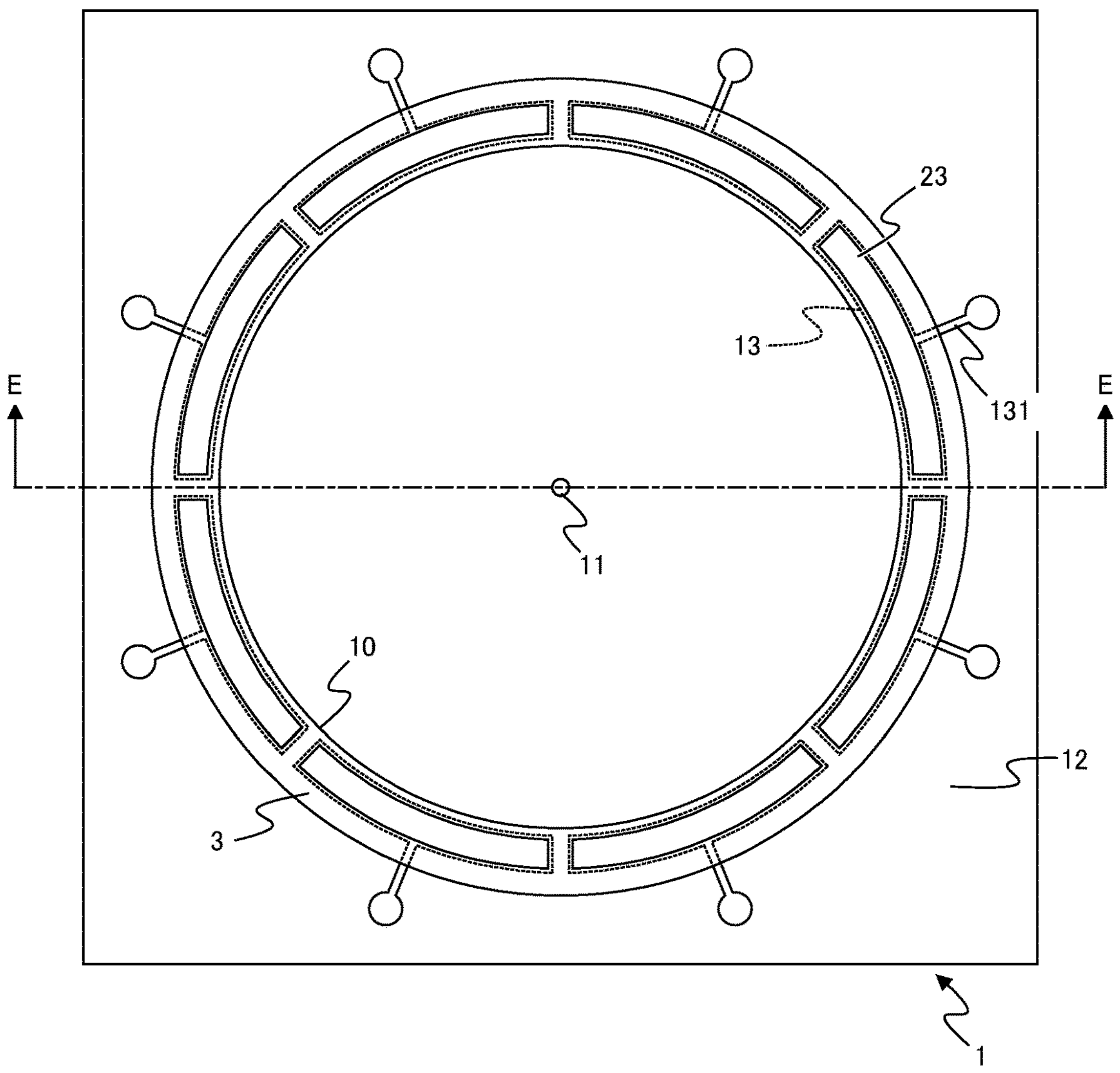
FIG. 10 is a plan view showing the bonded upper and lower wafers.
Figure 11:
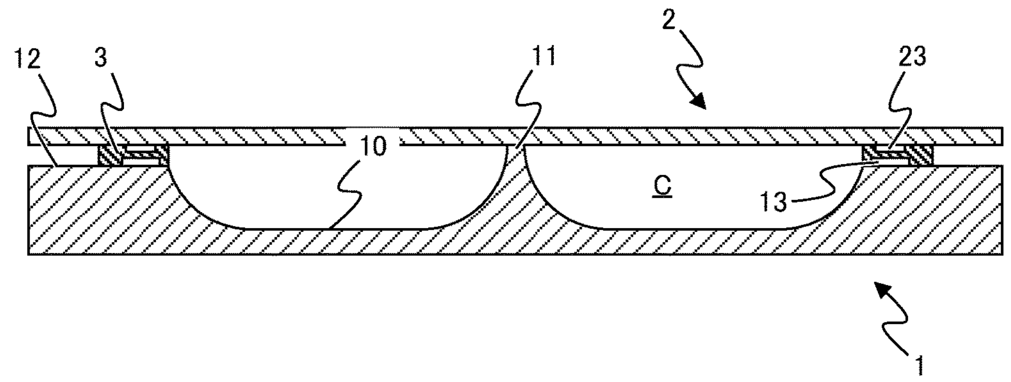
FIG. 11 is a cross section of FIG. 10 cut by the E-E line.

The bonding step is described below. FIG. 10 is a plan view showing the bonded upper and lower wafers. FIG. 11 is a cross section of FIG. 10 cut by the E-E line.

The bonding step is a step to bond the bottom surface of the upper wafer 2 and the top surface of the lower wafer 1 so that the plurality of first electrodes 13 and their corresponding plurality of second electrodes 23 are superimposed, as shown in FIGS. 10 and 11. In the bonding step, the upper wafer 2 and the lower wafer are aligned by a double-sided aligner and fixed by pressure, and then temporarily baked by a vacuum heater at 300 to 500° ° C. under an ambient having a predetermined cavity pressure P1 to bond the upper wafer 2 and the lower wafer 1. As a result, the cavity pressure becomes P1, which is the pressure within the annular cavity C defined by the recess 10 on the lower wafer 1, the stem 11, the bottom surface of the upper wafer 2, and the deposition pattern 3.

If the upper wafer 2 and the lower wafer 1 are made of Tempax glass or silicon, the upper wafer 2 and the lower wafer 1 may be bonded together using an anodic bonder instead of a double-sided aligner. Regardless of which method is used, this bonding step can keep alignment errors at the semiconductor process level (5 um or less).

Radially-Outer-Portion Separating Step

Figure 12:
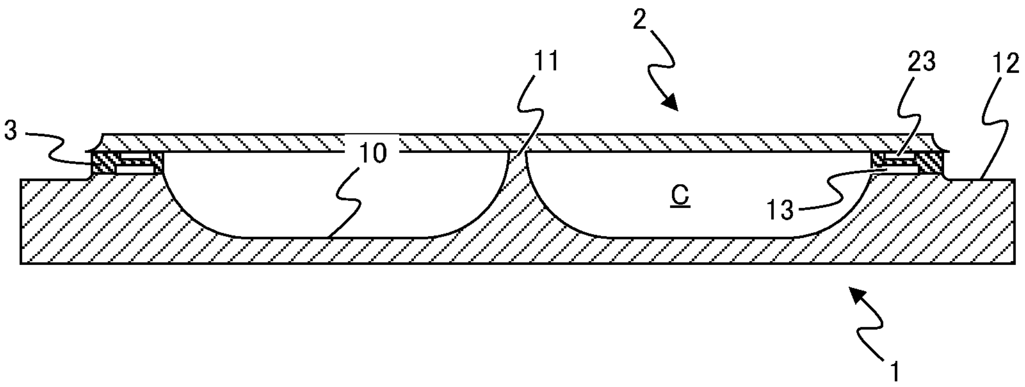
FIG. 12 is a cross-sectional side view showing the upper wafer with the radially outer portion separated.

The radially-outer-portion separating step is described below. FIG. 12 is a cross-sectional side view showing the upper wafer with the radially outer portion separated. FIG. 12 shows a cross section corresponding to that shown in FIGS. 3, 5, 7, and 11, and shows a cross section cut by a plane extending in the vertical and horizontal directions in the figure and passing through the stem.

The radially-outer portion separating step is a step to separate the radially outer portion of the upper wafer 2 by etching, as shown in FIG. 12. On the upper wafer 2, the radially outer portion refers to the area radially outer than the deposition pattern 3, assuming that the center of the stem 11 is the center of a circle.

The unequal-pressure heating step may deform the upper wafer 2 into a three-dimensional shape, as will be described in detail later, however, etching the flat upper wafer 2 prior to the unequal-pressure heating step allows the precision patterns of the semiconductor process to be applied and eliminates the need for expensive laser cutting and polishing steps.

Although the etching step may produce sharp-edged portions at the periphery of the upper wafer 2, such edges of the upper wafer 2 will be rounded when heat-treated by the equal-pressure and unequal-pressure heating steps. As a result, the curved surface supported structure manufactured by this manufacturing method has a high energy confinement effect when used as a hemispherical resonator gyroscope, resulting in an improved Q-factor.

Equal-Pressure Heating Step, and Unequal-Pressure Heating Step

Figure 13:
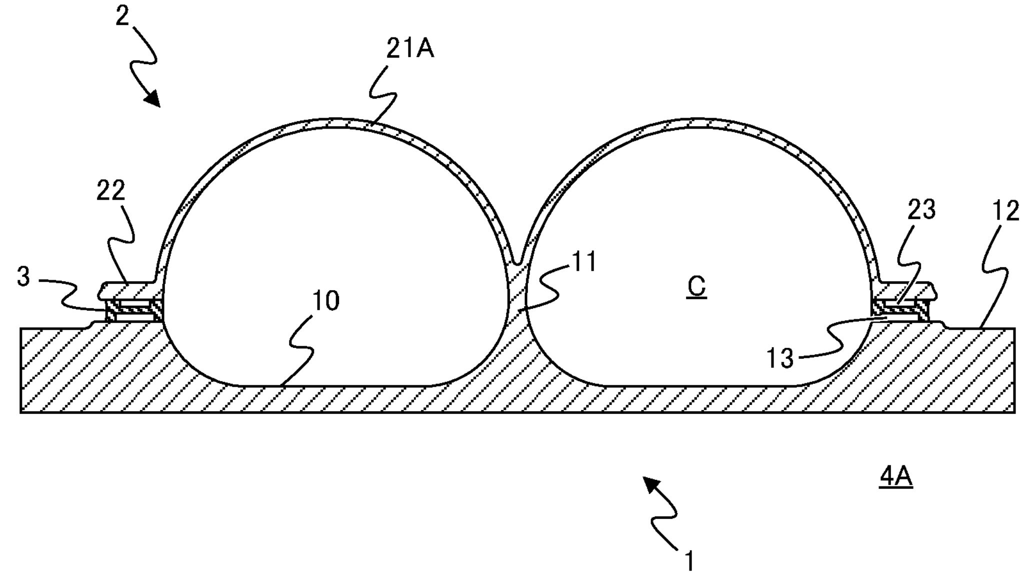
FIG. 13 is a cross-sectional side view showing the upper and lower wafers heated in a vacuum with the pressure in the chamber being lower than the sealed space.
Figure 16:
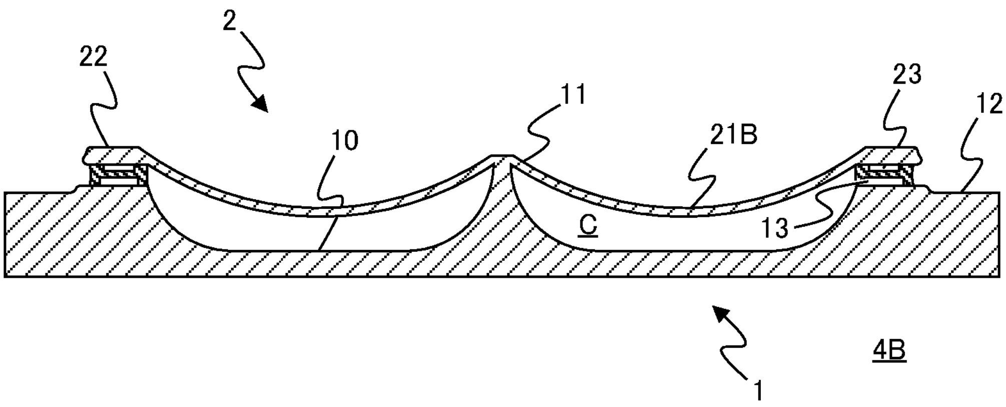
FIG. 16 is a cross-sectional side view showing the upper and lower wafers heated in a vacuum with the pressure in the chamber being higher than the sealed space.

The equal-pressure heating step and the unequal-pressure heating step are described below. FIGS. 13 and 16 show cross-sectional side views of the upper wafer and the lower wafer heated in a vacuum with the pressure in the chamber lower than the sealed space and the pressure in the chamber higher than the sealed space, respectively. FIGS. 13 and 16 show the cross sections cut by the same planes as in FIG. 12.

The equal-pressure heating step is a step in which the upper wafer 2 and the lower wafer 1 are vacuum heated until they soften, with the ambient pressure P2, which is the pressure in the chamber of the vacuum machine, generally equal to the cavity pressure P1. In the equal-pressure heating step, the temperature in the chamber should be 1200~1400° C. if the material of the upper wafer 2 and the lower wafer 1 is quartz, and 500~600° C. if the material is Tempax glass. The equal-pressure heating step fuses the stem 11 of the lower wafer 1 and the upper wafer 2 into one piece, and also fuses the deposition pattern 3 made of liquid glass to the lower wafer 1 and the upper wafer 2, thereby making the cavity C airtight. The equal-pressure heating step may be omitted from this manufacturing method, because the fusing of the lower wafer 1 to the upper wafer 2 and the fusing of the deposition pattern 3 to the lower wafer 1 and the upper wafer 2 may also be effected in the unequal-pressure heating step.

The unequal-pressure heating step is a step in which the upper wafer 2 and the lower wafer 1 are vacuum heated to the point of softening while the ambient pressure P2 is made different from the cavity pressure P1, that is, the ambient pressure P2 is made lower than the cavity pressure P1 or the ambient pressure P2 is made higher than the cavity pressure P1. In the unequal-pressure heating step, the temperature in the chamber should be 1400 to 1700° C. if the material of the upper wafer 2 and the lower wafer 1 is quartz, and 600 to 700° C. if the material is Tempax glass.

When the ambient pressure P2 is lower than the cavity pressure P1 in the unequal-pressure heating step, the cavity C expands to deform a part of the upper wafer 2 to form an annular convex surface 21A having a curved surface projecting upward along an annulus as shown in FIG. 13. The portion of the upper wafer 2 fused to the annular deposition pattern 3 is not deformed, and a flange 22 is formed projecting radially outward from the periphery of the annular convex surface 21A.

Alternatively, when the ambient pressure P2 is higher than the cavity pressure P1 in the unequal-pressure heating step, the cavity C contracts to deform a part of the upper wafer 2 to form an annular concave surface 21B having a curved surface projecting downward along an annulus as shown in FIG. 16. As in the case where the annular convex surface 21A is formed, the portion of the upper wafer 2 fused to the annular deposition pattern 3 is not deformed, and a flange 22 is formed projecting radially outward from the periphery of the annular concave surface 21B.

In either the unequal-pressure heating step in which the ambient pressure P2 is lower than the cavity pressure P1, or the unequal-pressure heating step in which the ambient pressure P2 is higher than the cavity pressure P1, the thickness, height, curvature, etc. of the annular convex surface 21A or the annular concave surface 21B can be made as desired by adjusting the pressure difference between the cavity pressure P1 and the ambient pressure P2, the temperature in the chamber during vacuum heating, the lifting time of the lifting mechanism in the vacuum heater, etc.

In the unequal-pressure heating step, the composition of the liquid glass that forms the deposition pattern 3 becomes closer to that of quartz, which improves the air tightness in cavity C, but its chemical resistance becomes worse compared to that of the materials of the upper wafer 2 and the lower wafer 1.

Sacrificial Layer Removing Step

Figure 14:
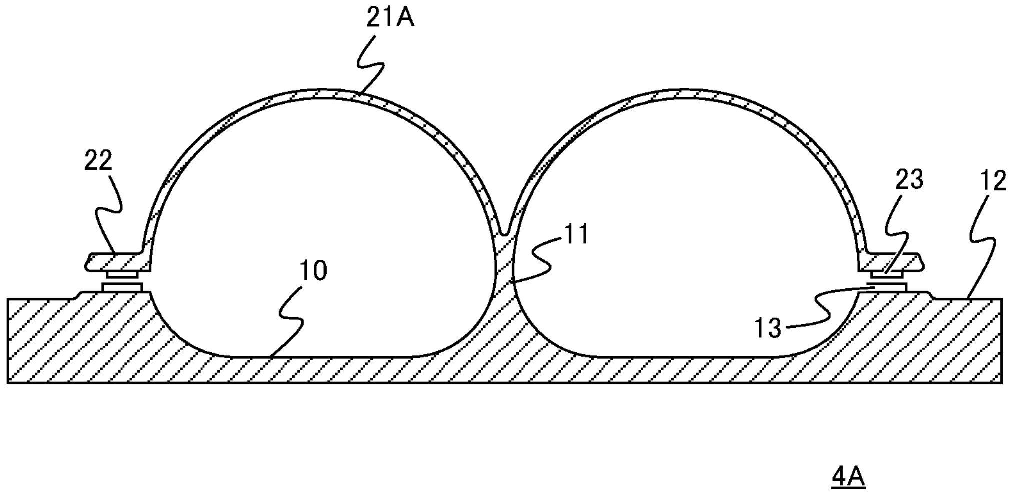
FIG. 14 is a cross-sectional side view showing the configuration of a curved surface supported structure with an annular convex surface.
Figure 15:
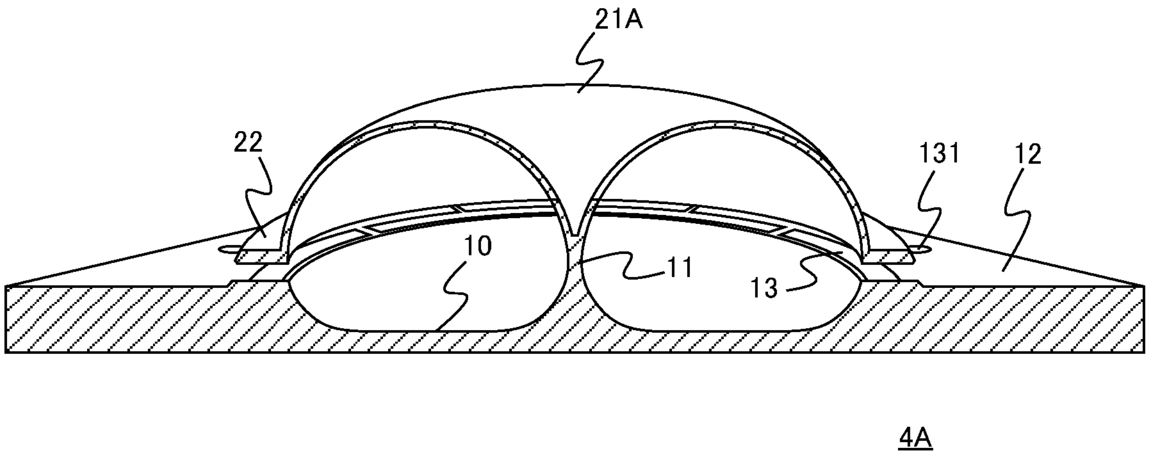
FIG. 15 is a cross-sectional perspective view showing the configuration of a curved surface supported structure with an annular convex surface.
Figure 17:
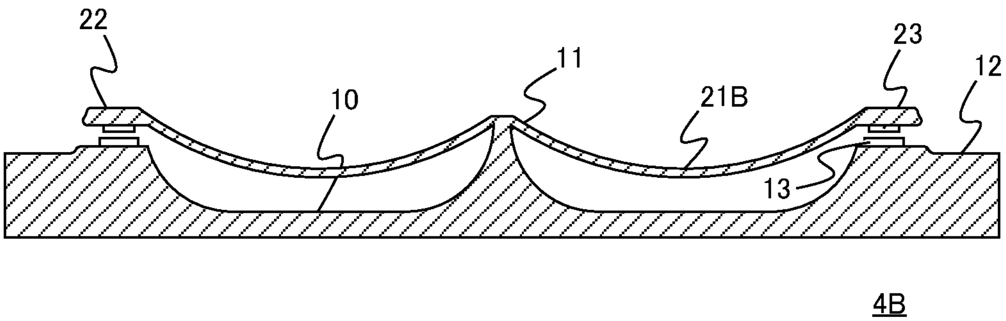
FIG. 17 is a cross-sectional side view showing the configuration of a curved surface supported structure with an annular concave surface.
Figure 18:
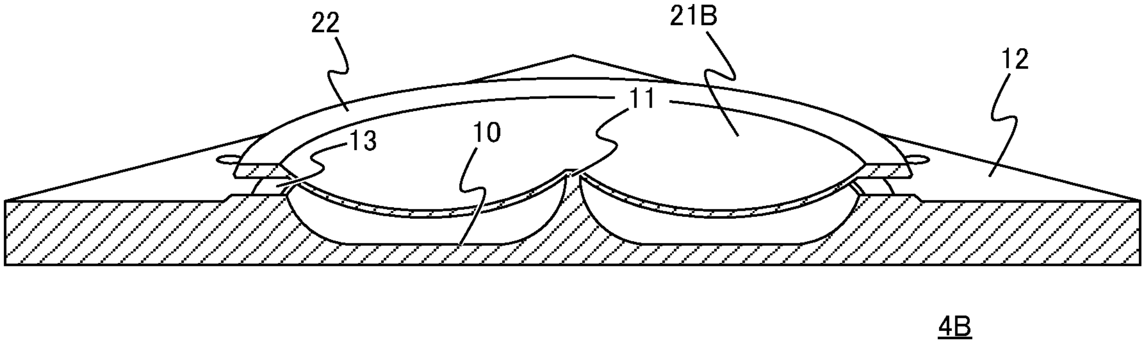
FIG. 18 is a cross-sectional perspective view each showing the configuration of a curved surface supported structure with an annular concave surface.
Figure 19:
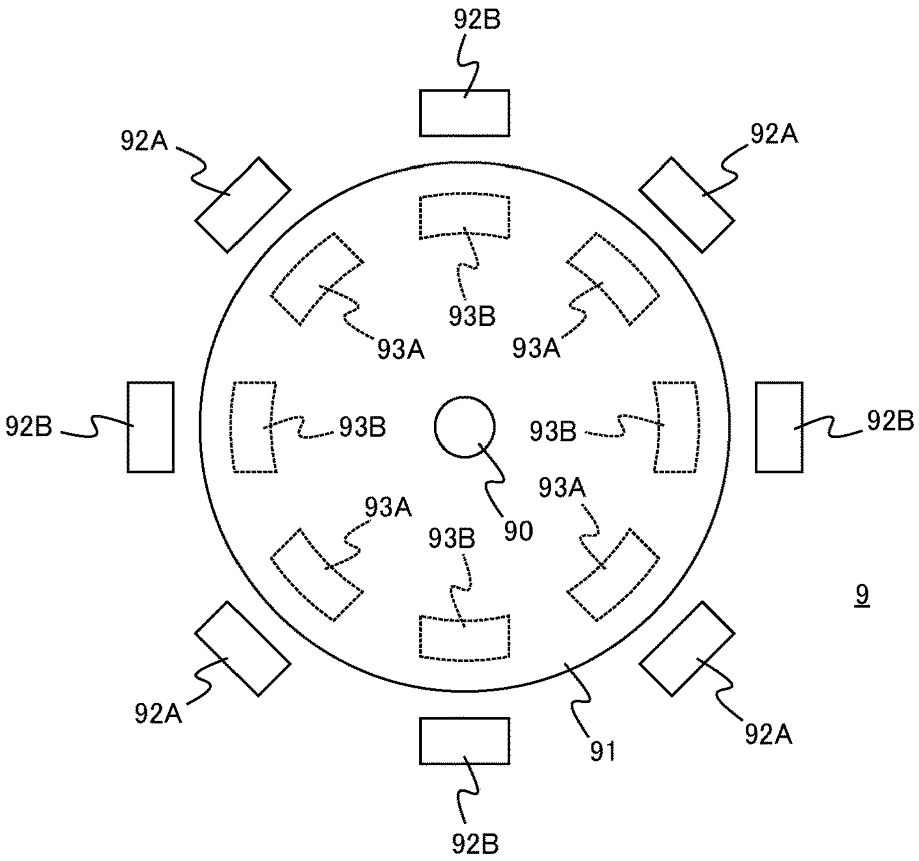
FIG. 19 is a schematic plan view showing the configuration of a conventional hemispherical resonator gyroscope.
Figure 20:
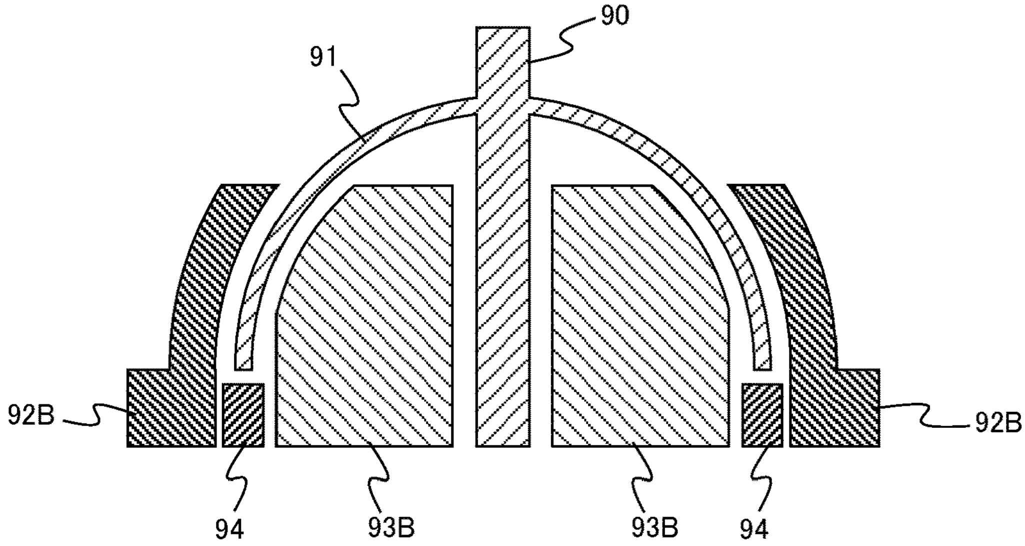
FIG. 20 is a cross-sectional side view showing the configuration of a conventional hemispherical resonator gyroscope.

The sacrificial layer removing step is described below. FIGS. 14 and 15 are a cross-sectional side view and a cross-sectional perspective view, respectively, showing the configuration of a curved surface supported structure with an annular convex surface. FIGS. 17 and 18 are a cross-sectional side view and a cross-sectional perspective view, respectively, showing the configuration of a curved surface supported structure with an annular concave surface. FIGS. 14, 15, 17, and 18 all show the cross sections cut by the same planes as in FIGS. 12 and 13.

The sacrificial layer removing step is a step to remove the deposition pattern 3 formed with liquid glass by etching. The deposition pattern 3, which is denatured by vacuum heating, has a faster etch rate than the other portions and can be selectively removed by etching. Alternatively, chemicals that etches only the liquid glass forming the deposition pattern 3 may be used in the sacrificial layer removing step.

The sacrificial layer removing step produces a curved surface supported structure 4A having an upwardly projecting annular convex surface 21A, as shown in FIGS. 14 and 15, or a curved surface supported structure 4B having a downwardly projecting annular concave surface 21B, as shown in FIGS. 17 and 18. The curved surface supported structure 4A has an annular convex surface 21A, a flange 22, a stem 11 supporting the annular convex surface 21A at a generally central position, first electrodes 13, and second electrodes 23. The curved surface supported structure 4B differs from the curved surface supported structure 4A only in that it has an annular concave surface 21B instead of an annular convex surface 21A.

With the manufacturing methods described above, the curved surface supported structures 4A and 4B, which can be used as hemispherical resonator gyroscopes, can be manufactured using existing low-cost processes. In this manufacturing method, an annular convex surface 21A or an annular concave surface 21B, a stem 11, respectively, having a three-dimensional structure, first electrodes 13 and second electrodes 23 are integrally formed. Therefore, no mechanical alignment is required in the manufacturing steps, and when the curved surface supported structures 4A or 4B are used as hemispherical resonator gyroscopes, performance degrading phenomena caused by misalignment such as drift are prevented.

In the description of this embodiment, while the plurality of first electrodes 13 and the plurality of second electrodes 23 are assumed to be arranged in an annular pattern, the plurality of first electrodes 13 may be arranged on the radially-outer-surface 12, and the plurality of second electrodes 23 may be arranged on the bottom surface of the upper wafer 2, corresponding to the plurality of first electrodes 13.

The embodiments of the present invention have been presented by way of example only, and are not intended to limit the scope of the invention. The novel embodiments described herein may be embodied in a variety of other forms; furthermore, various omissions, substitutions and changes may be made without departing from the spirit of the invention. The embodiments and modifications are included in the scope or spirit of the present invention and in the appended claims and their equivalents.

REFERENCE SIGNS LIST

1 Lower wafer
2 Upper wafer
3 Deposition pattern
4A, 4B Curved surface supported structure
10 Recess
11 Stem
12 Radially-outer-surface
13 First electrode
23 Second electrode
21A Annular convex surface
21B Annular concave surface
22 Flange

The invention claimed is:

1. A method for manufacturing a curved surface supported structure comprising an upper wafer and a lower wafer, the method comprising:

forming an annular recess on an upper surface of the lower wafer by etching, and a stem having a tip higher than a radially-outer-surface at a center of the annular recess by etching the radially-outer-surface, wherein the radially-outer-surface is a plane located at a radially outer side of the annular recess;

forming a plurality of first electrodes arranged on the radially-outer-surface;

forming a sacrificial layer, which is an annular deposition pattern on the plurality of first electrodes;

forming a plurality of second electrodes, which are arranged on a bottom surface of the upper wafer in correspondence with the plurality of first electrodes;

bonding the upper wafer and the lower wafer with the sacrificial layer in between so that the plurality of first electrodes and the plurality of second electrodes are superimposed;

separating a radially outer portion, which is located at a radially outer side of the upper wafer relative to the plurality of second electrodes by etching after the bonding;

vacuum heating the upper wafer, the lower wafer, and the sacrificial layer under a condition where a pressure in a cavity defined by the upper wafer, the lower wafer, and the sacrificial layer is different from an ambient pressure after the separating; and removing the sacrificial layer by etching after the vacuum heating at the pressure different from the ambient pressure.

2. The method for manufacturing a curved surface supported structure as claimed in claim 1, further comprising vacuum heating the upper wafer, the lower wafer, and the sacrificial layer under a condition where the pressure in the cavity is equal to the ambient pressure after the separating and before the vacuum heating at the pressure different from the ambient pressure.

3. The method for manufacturing a curved surface supported structure according to claim 2, wherein the upper wafer and the lower wafer are made of silicon compounds and the annular deposition pattern is formed with liquid glass.

4. The method for manufacturing a curved surface supported structure as claimed in claim 2, wherein the vacuum heating at the pressure different from the ambient pressure is performed under a condition where the ambient pressure is lower than the pressure in the cavity.

5. The method for manufacturing a curved surface supported structure as claimed in claim 2, wherein the vacuum heating at the pressure different from the ambient pressure is performed under a condition where the ambient pressure is higher than the pressure in the cavity.

6. The method for manufacturing a curved surface supported structure as claimed in claim 2, wherein the plurality of first electrodes are arranged in an annular pattern on the radially-outer-surface and the plurality of second electrodes are arranged in an annular pattern on the bottom surface of the upper wafer corresponding to the plurality of first electrodes.

7. The method for manufacturing a curved surface supported structure according to claim 1, wherein the upper wafer and the lower wafer are made of silicon compounds and the annular deposition pattern is formed with liquid glass.

8. The method for manufacturing a curved surface supported structure as claimed in claim 7, wherein the vacuum heating at the pressure different from the ambient pressure is performed under a condition where the ambient pressure is lower than the pressure in the cavity.

9. The method for manufacturing a curved surface supported structure as claimed in claim 7, wherein the vacuum heating at the pressure different from the ambient pressure is performed under a condition where the ambient pressure is higher than the pressure in the cavity.

10. The method for manufacturing a curved surface supported structure as claimed in claim 7, wherein the plurality of first electrodes are arranged in an annular pattern on the radially-outer-surface and the plurality of second electrodes are arranged in an annular pattern on the bottom surface of the upper wafer corresponding to the plurality of first electrodes.

11. The method for manufacturing a curved surface supported structure as claimed in claim 1, wherein the vacuum heating at the pressure different from the ambient pressure is performed under a condition where the ambient pressure is lower than the pressure in the cavity.

12. The method for manufacturing a curved surface supported structure as claimed in claim 11, wherein the plurality of first electrodes are arranged in an annular pattern on the radially-outer-surface and the plurality of second electrodes are arranged in an annular pattern on the bottom surface of the upper wafer corresponding to the plurality of first electrodes.

13. The method for manufacturing a curved surface supported structure as claimed in claim 1, wherein the vacuum heating at the pressure different from the ambient pressure is performed under a condition where the ambient pressure is higher than the pressure in the cavity.

14. The method for manufacturing a curved surface supported structure as claimed in claim 13, wherein the plurality of first electrodes are arranged in an annular pattern on the radially-outer-surface and the plurality of second electrodes are arranged in an annular pattern on the bottom surface of the upper wafer corresponding to the plurality of first electrodes.

15. The method for manufacturing a curved surface supported structure as claimed in claim 1, wherein the plurality of first electrodes are arranged in an annular pattern on the radially-outer-surface and the plurality of second electrodes are arranged in an annular pattern on the bottom surface of the upper wafer corresponding to the plurality of first electrodes.

* * * * *